(12) United States Patent
Uemichi

(10) Patent No.: US 10,170,815 B2
(45) Date of Patent: Jan. 1, 2019

(54) FILTER AND METHOD OF DESIGNING SAME

(71) Applicant: FUJIKURA LTD., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/433,444

(22) Filed: Feb. 15, 2017

(65) Prior Publication Data

US 2017/0250452 A1    Aug. 31, 2017

(30) Foreign Application Priority Data

Feb. 26, 2016  (JP) ................................ 2016-036110

(51) Int. Cl.

| | |
|---|---|
| H01P 1/08 | (2006.01) |
| H01P 1/203 | (2006.01) |
| G06F 17/50 | (2006.01) |
| H01P 3/08 | (2006.01) |
| H01P 1/207 | (2006.01) |
| H01P 5/107 | (2006.01) |

(52) U.S. Cl.
CPC ...... *H01P 1/20309* (2013.01); *G06F 17/5063* (2013.01); *G06F 17/5077* (2013.01); *H01P 1/207* (2013.01); *H01P 3/08* (2013.01); *H01P 5/107* (2013.01)

(58) Field of Classification Search
CPC ..... H01P 1/20309; H01P 3/08; G06F 17/5077
USPC ........................................................ 333/204
See application file for complete search history.

(56) References Cited

U.S. PATENT DOCUMENTS

| | | | |
|---|---|---|---|
| 6,072,376 A | * | 6/2000 | Matsuyoshi .......... H01P 1/2053 330/124 R |
| 2003/0156806 A1 | | 8/2003 | Maruhashi et al. |
| 2011/0084398 A1 | | 4/2011 | Pilard et al. |
| 2015/0077196 A1 | | 3/2015 | Yatabe |

FOREIGN PATENT DOCUMENTS

| | | |
|---|---|---|
| JP | 2002-26611 A | 1/2002 |
| JP | 2014-236291 A | 12/2014 |
| JP | 2015-56814 A | 3/2015 |

(Continued)

OTHER PUBLICATIONS

Decision to Grant a Patent dated Jul. 4, 2017, issued in counterpart Japanese Application No. 2016-036110, with English translation. (5 pages).

(Continued)

*Primary Examiner* — Robert J Pascal
*Assistant Examiner* — Kimberly Glenn
(74) *Attorney, Agent, or Firm* — Westerman, Hattori, Daniels & Adrian, LLP

(57) ABSTRACT

A filter includes: a first resonator and a second resonator; a first strip-shaped conductor which is provided on a dielectric layer provided on a surface of a first wide wall of the first resonator; a first conductor pin which is electrically connected to a first end of the first strip-shaped conductor; a second strip-shaped conductor which is provided on a dielectric layer provided on a surface of a first wide wall of the second resonator; and a second conductor pin which is electrically connected to a first end of the second strip-shaped conductor.

6 Claims, 10 Drawing Sheets

(56) References Cited

FOREIGN PATENT DOCUMENTS

JP          2015-76836 A     4/2015

OTHER PUBLICATIONS

Chen et al., "Dual-Band Vertically Stacked Laminated Waveguide Filter Design in LTCC Technology", IEEE Transactions on Microwave Theory and Techniques, vol. 57, No. 6, pp. 1554-1562, Issued on May 12, 2009.
Hong et al., "Microstrip Filter for RF/Microwave Applications", Wiley, ch. 8, 2001.
Lee et al., "SIW (Substrate Integrated Waveguide) Quasi-Elliptic Filter Based on LTCC for 60-GHz Application", Proceedings of the 4th European Microwave Integrated Circuits Conference, pp. 204-207, Sep. 2009.
Japanese Office Action dated Jan. 31, 2017, issued in JP 2016-036110, pp. 1-4.
Office Action dated May 9, 2017, issued in counterpart Japanese Application No. 2016-036110. (3 pages).

* cited by examiner

FILTER AND METHOD OF DESIGNING SAME

This Nonprovisional application claims priority under 35 U.S.C. § 119 on Patent Application No. 2016-036110 filed in Japan on Feb. 26, 2016, the entire contents of which are hereby incorporated by reference.

TECHNICAL FIELD

The present invention relates to (i) a direct-coupled-resonator filter which serves as a band-pass filter for microwaves and (ii) a method of designing such a filter.

BACKGROUND ART

A direct-coupled-resonator filter has been conventionally known as a band-pass filter for microwaves. A direct-coupled-resonator filter is configured to include a plurality of resonators which are coupled in series (for example, N resonators, where N is an integer greater than or equal to 2). A first resonator is connected to a signal source, and a last resonator is connected to a load resistor. A coupling degree between the first resonator and the signal source, and a coupling degree between the last resonator and the load resistor are each referred to as an external Q factor or referred to as an external coupling coefficient. The present disclosure utilizes the term "external Q factor $Q_e$."

Non-patent Literature 1 discloses the following Expression (1), which defines a relationship between (i) a frequency band of electromagnetic waves passed by a filter and (ii) the external Q factor $Q_e$, which relationship occurs in a case where a plurality of resonators are symmetrically configured (i.e., a configuration of the plurality of resonators when viewed from a side of the first resonator is equivalent to a configuration of the plurality of resonators when viewed from a side of the last resonator).

$$\Delta\omega_{3dB} = \Delta\omega_+ - \Delta\omega_- = \omega_0/(Q_e/2) \quad \text{[Expression (1)]}$$

Here, $\omega_0$ denotes a center frequency at which |S21|, an S-parameter expressing transmission, becomes greatest; $\Delta\omega_{3dB}$ denotes a bandwidth of a band (hereinafter, referred to as a "3 dB band") where |S21| is attenuated by 3 dB in comparison to |S21($\omega_0$)|; $\Delta\omega_-$ denotes a lower limit frequency of the 3 dB band; and $\Delta\omega_+$ denotes an upper limit frequency of the 3 dB band.

Expression (1) can be expressed as in Expression (2), and Expression (2) can be expressed as in Expression (3).

$$Q_e = 2\omega_0/(\Delta\omega_+ - \Delta\omega_-) \quad \text{[Expression 2]}$$

$$Q_e = 2f_0/(f_2 - f_1) \quad \text{[Expression 3]}$$

In Expression (3), $f_0$ denotes a center frequency corresponding to the abovementioned center frequency $\omega_0$; $f_1$ denotes a lower limit frequency, of the 3 dB band, corresponding to $\Delta\omega_-$; and $f_2$ denotes an upper limit frequency of, the 3 dB band, corresponding to $\Delta\omega_+$.

It is known that the external Q factor $Q_e$ is proportional to the inverse of a fractional bandwidth of a filter. It is therefore possible to realize a filter having a desired fractional bandwidth by adjusting the external Q factor $Q_e$ of the filter to a desired value.

FIG. 1 and FIG. 10 of Non-patent Literature 2 each illustrate a filter configured by four (4) resonators R1 through R4. The resonators R1 through R4 employ a configuration using a post-wall waveguide technique. A post-wall waveguide is configured to include (i) a dielectric substrate, (ii) a post wall composed of a plurality of conductor posts provided in the dielectric substrate in a fence-like manner, and (iii) an upper and lower wide wall, which are provided on an upper and lower surface of the dielectric substrate, respectively. Note that a post-wall waveguide is also referred to as a substrate integrated waveguide (SIW).

As illustrated in FIG. 10 of Non-patent Literature 2, a part of the resonator R1 which electromagnetic waves enter (or a part of the resonator R4 which electromagnetic waves exit) includes (i) a strip-shaped conductor which is obtained by stretching, in one direction, an electric conductor plate of which an upper wide wall of the resonator R1 (or the resonator R4) is composed, and (ii) slots for separating the strip-shaped conductor from the upper wide wall. The strip-shaped conductor and the lower wide wall constitute a micro strip line. Note that no post wall is provided under the strip-shaped conductor.

With the configuration, the filter of Non-patent Literature 2 makes it possible to alter the external Q factor $Q_e$ by altering the length of the slots (see FIG. 9 of Non-patent Literature 2). Note that the results indicated in FIG. 9 were obtained not by using the construction illustrated in FIG. 10, but by using the construction illustrated in FIG. 8.

FIG. 1 through FIG. 3 of Patent Literature 1 illustrate an input/output structure 10, of dielectric waveguide tube, which is included in a dielectric waveguide tube duplexer 11. The input/output structure 10 of the dielectric waveguide tube is composed of a low-frequency-side dielectric waveguide tube resonator 20a, a high-frequency-side dielectric waveguide tube resonator 20b, and a coaxial connector 70. The dielectric waveguide tube resonators 20a and 20b are configured such that a conductor film covers the exterior of a substantially rectangular-parallelepiped-shaped dielectric.

A side surface 20a1 of the dielectric waveguide tube resonator 20a has a coupling window 40a via which the dielectric is exposed. Similarly, a side surface 20b1 of the dielectric waveguide tube resonator 20b has a coupling window 40b via which the dielectric is exposed. The side surfaces 20a1 and 20b1 of the input/output structure 10 are provided opposite to each other so that the coupling windows 40a and 40b are aligned with each other.

Each of the coupling windows 40a and 40b includes a linear-shaped probe 50 made from a conductor film. A first end of the probe 50 is connected to a feed point 60, while a second end of the probe 50 is connected to a conductor film provided in a periphery of the coupling windows 40a and 40b. The coaxial connector 70 is provided on the feed point 60.

As illustrated in FIG. 5 of Patent Literature 1, the dielectric waveguide tube resonator 20a is provided so as to be followed, in series, by dielectric resonators 21a, 22a, and 23a. The dielectric resonators 20a, 21a, 22a, and 23a constitute a resonator group 11a for reception on a low frequency side. Similarly, the dielectric waveguide tube resonator 20b is provided so as to be followed, in series, by dielectric resonators 21b, 22b, and 23b. The dielectric resonators 20b, 21b, 22b, and 23b constitute a resonator group 11b for reception on a high frequency side. The resonator groups 11a and 11b function as a filter.

Patent Literature 1 discloses a technique for adjusting an external Q factor (referred to as "external Q" in Patent Literature 1) by adjusting distances D40a and D40b illustrated in FIG. 3 of Patent Literature 1. The distance D40a refers to a distance between (i) a side surface 20a2, which is contiguous with and orthogonal to the side surface 20a1 of the dielectric waveguide tube resonator 20a, and (ii) a center of the probe 50. Similarly, the distance D40b refers to a distance between (i) a side surface 20b2, which is contiguous with and orthogonal to the side surface 20b1 of the dielectric waveguide tube resonator 20b, and (ii) the center of the probe 50.

Furthermore, Patent Literature 1 discloses, with reference to FIG. 7 of the same, a technique for decreasing the external Q factor by configuring a tip part 51a of a probe 51 to have a width w51a that is greater than a width w51 of the probe 51.

CITATION LIST

Patent Literature

[Patent Literature 1]
Japanese Patent Application Publication, Tokukai, No. 2015-56814 (Publication date: Mar. 23, 2015)

Non-Patent Literature

[Non-patent Literature 1]
J.-S. Hong and M. J. Lancaster, "Microstrip Filters for RF/Microwave Applications", Wiley, 2001, ch. 8.
[Non-patent Literature 2]
G.-H. Lee et. al., "SIW (Substrate Integrated Waveguide) quasi-elliptic filter based on LTCC for 60-GHz application", in Proc. 8th EuMIC, pp. 204-207, Sep. 2009.

SUMMARY OF INVENTION

Technical Problem

Unfortunately, the techniques disclosed in Non-patent Literature 2 afford only a small degree of freedom in designing a filter. This is because slot length is the only parameter by which the external Q factor can be controlled.

While the techniques disclosed in Patent Literature 1 do allow for adjustment of the external Q factor by using a plurality of parameters, the techniques also require that a coaxial connector be provided at a feed point. It follows that electromagnetic waves are necessarily transmitted to a filter via a coaxial cable.

In comparison with a microstrip line, a coaxial cable exhibits a stronger correlation between (i) higher frequency of transmitted electromagnetic waves and (ii) increase in transmission loss. Patent Literature 1 merely discloses transmission of a low frequency band (e.g., a frequency band whose center frequency is approximately 2 GHz; see FIGS. 4 and 6 of Patent Literature 1). However, in a case where a high frequency band (e.g., frequency band whose center frequency is approximately 60 GHz) is to be transmitted, the configuration of Patent Literature 1 has a problem of causing a large transmission loss, because a coaxial cable is utilized for electromagnetic wave transmission.

The present invention has been made in view of the above problems. An object of the present invention lies in providing a filter which enables adjustment of the external Q factor via a plurality of parameters while suppressing transmission loss even in a case where the filter is used for electromagnetic waves of a high frequency band. Another object of the present invention lies in providing a method for designing a filter having a desired external Q factor.

Solution to Problem

In order to solve the above problems, a filter in accordance with an aspect of the present invention includes: a first resonator and a second resonator each including a narrow wall and a pair of wide walls, the first resonator and second resonator being coupled to each other directly or via another resonator; a first strip-shaped conductor which is provided on a dielectric layer provided on a surface of a first wide wall of the first resonator; a first conductor pin which is (i) electrically connected to a first end of the first strip-shaped conductor and (ii) inserted into the first resonator; a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator.

In order to solve the abovementioned problems, a method, in accordance with an aspect of the present invention, for designing a filter is a method of designing a filter, the filter including: a first resonator and a second resonator each including a narrow wall and a pair of wide walls, the first resonator and second resonator being coupled to each other directly or via another resonator; a first strip-shaped conductor which is provided on a dielectric layer provided on a surface of a first wide wall of the first resonator; a first conductor pin which is (i) electrically connected to a first end of the first strip-shaped conductor and (ii) inserted into the first resonator; a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator, the method including the steps of: (A) obtaining a correlation, between a parameter and an external Q factor, occurring in a case of altering at least one parameter of first through third parameters, the first parameter being lengths of portions of the respective first and second conductor pins, which portions are inserted into the respective first and second resonators, the second parameter being (i) a distance between (a) a first short wall, constituting a portion of the narrow wall of the first resonator and (b) the first conductor pin and (ii) a distance between (c) a second short wall constituting a portion of the narrow wall of the second resonator and (d) the second conductor pin, the third parameter being widths of the respective first and second strip-shaped conductors; (B) determining, in accordance with a result of the step (A), a parameter corresponding to a desired external Q factor.

Advantageous Effects of Invention

An embodiment of the present invention makes it possible to provide a filter which (i) suppresses transmission loss even in a case where the filter is used for electromagnetic waves of a high frequency band, and (ii) also enables adjustment of the external Q factor via a plurality of parameters. An embodiment of the present invention also makes it possible to provide a filter having a desired external Q factor.

Figure 1:
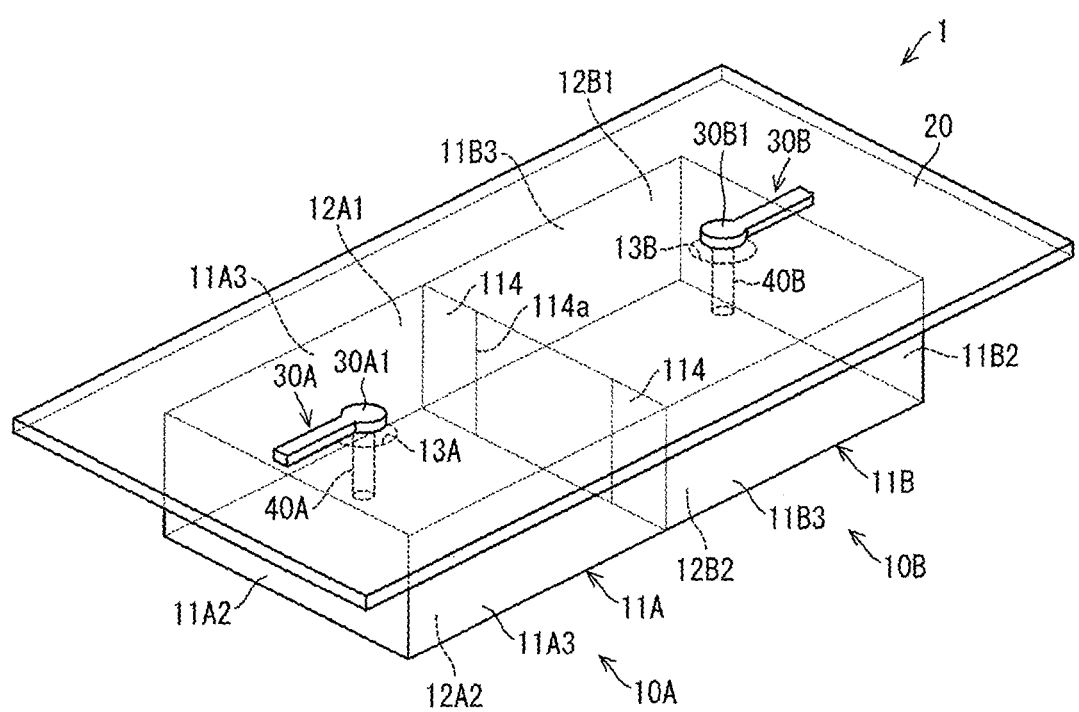
FIG. 1 is a perspective view illustrating a filter in accordance with an embodiment of the present invention.
Figure 2:
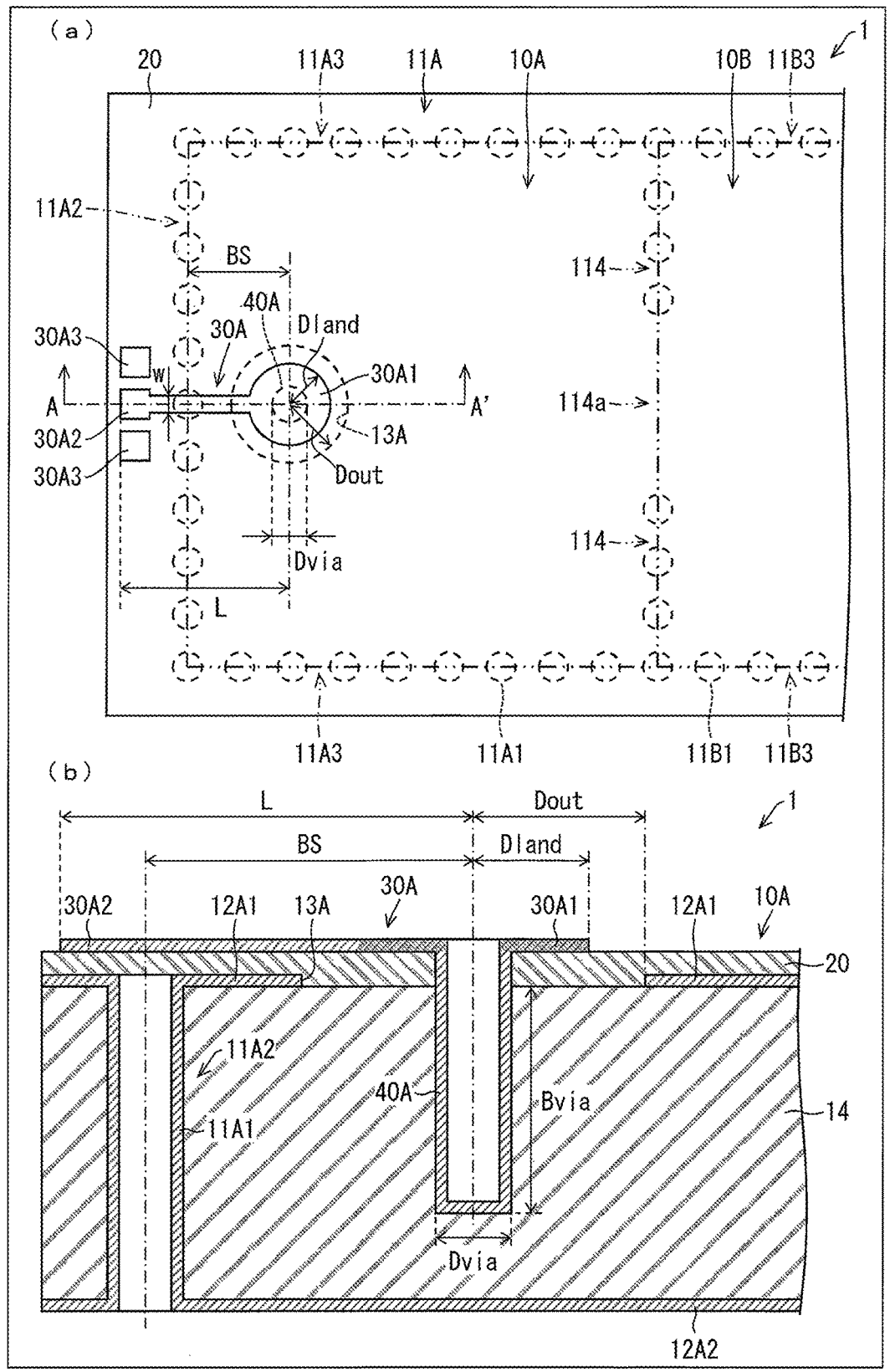

(a) of FIG. 2 is a plan view illustrating an example configuration of the filter illustrated in FIG. 1. (b) of FIG. 2 is an enlarged cross-sectional view of the filter illustrated in (a) of FIG. 2.

Figure 3:
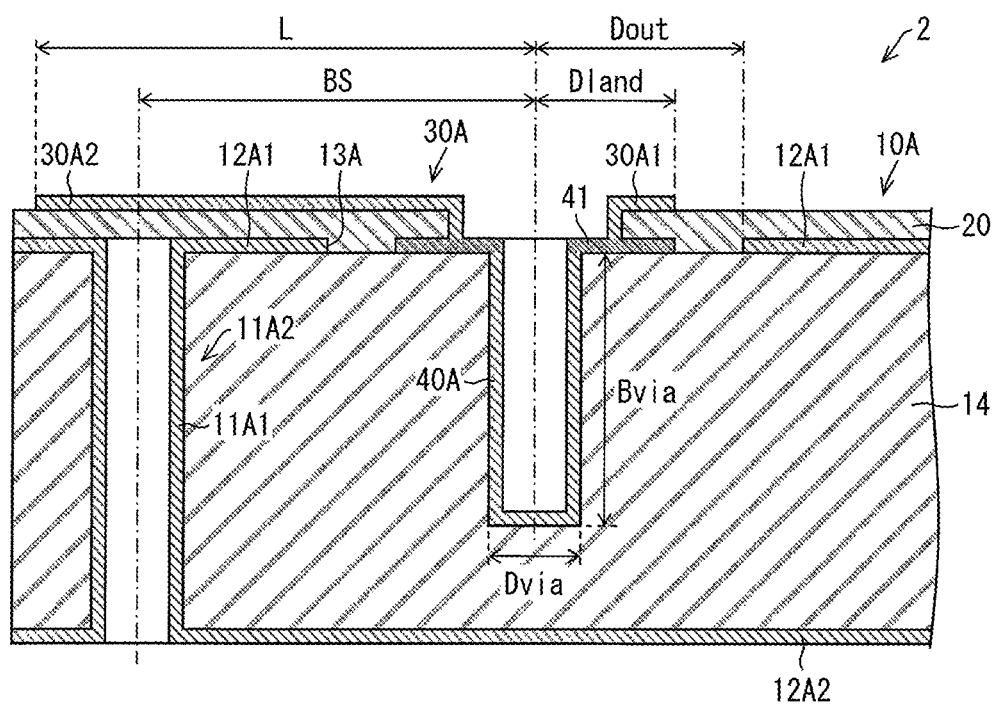

FIG. 3 is an enlarged cross-sectional view illustrating a first variation of the filter illustrated in FIG. 2.

Figure 4:
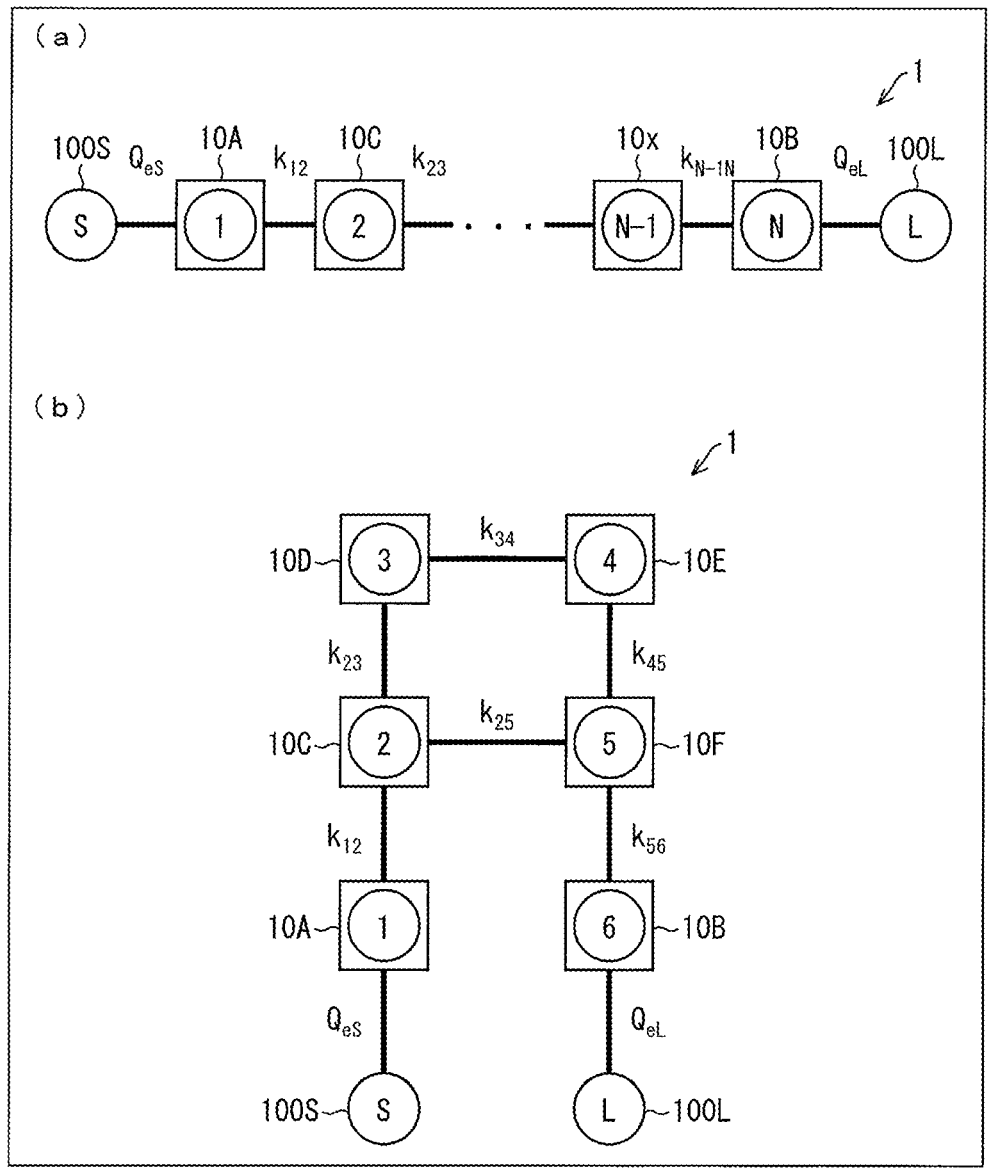

(a) of FIG. 4 is a block diagram illustrating a coupling topology of a second variation of the filter illustrated in FIG. 2. (b) of FIG. 4 is a block diagram illustrating coupling topology of a third variation of the filter illustrated in FIG. 2.

Figure 5:
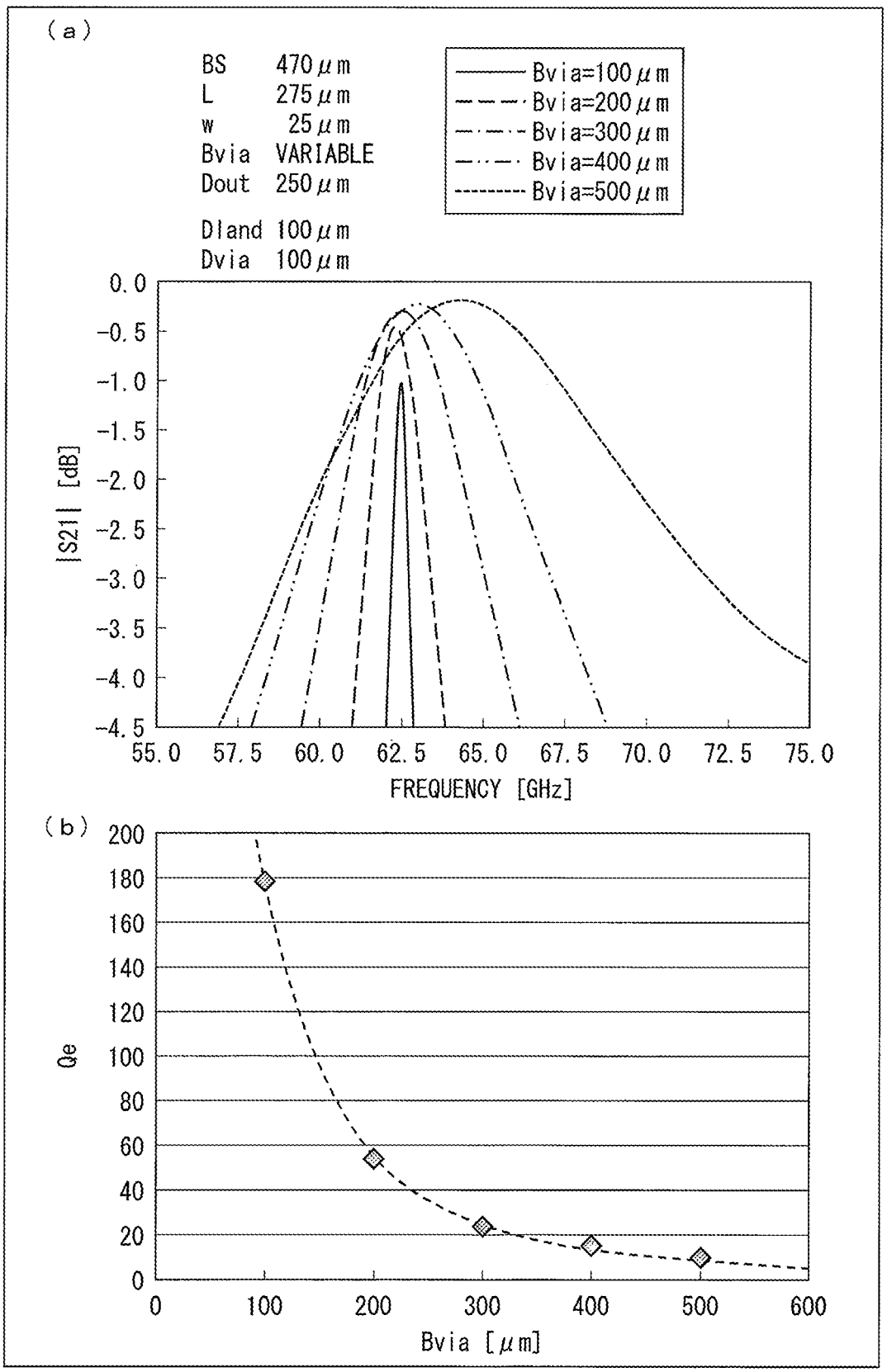

(a) of FIG. 5 is a graph showing frequency dependency of |S21| of a filter in accordance with Example Group 1 of the present invention. (b) of FIG. 5 is a graph showing a correlation between (i) an external Q factor $Q_e$ and (i) a length Bvia of a blind via of a filter in accordance with Example Group 1.

Figure 6:
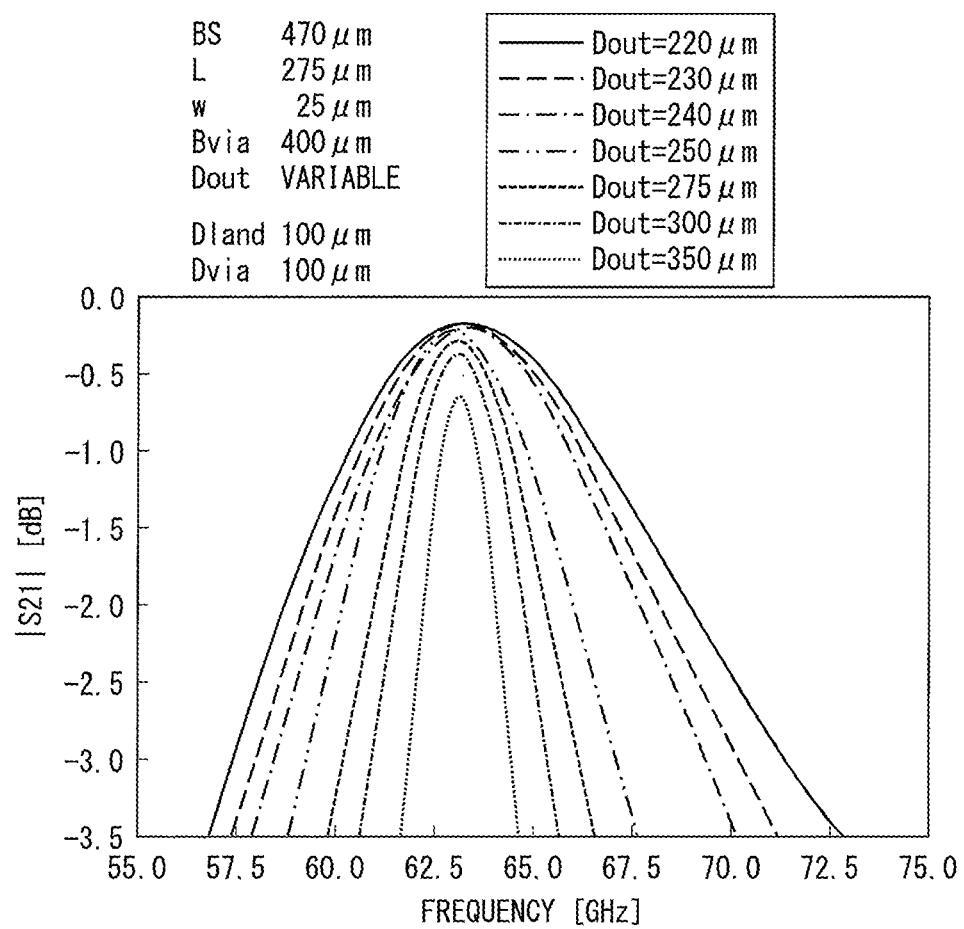

FIG. 6 is a graph showing frequency dependency of |S21| of a filter in accordance with Example Group 2 of the present invention.

Figure 7:
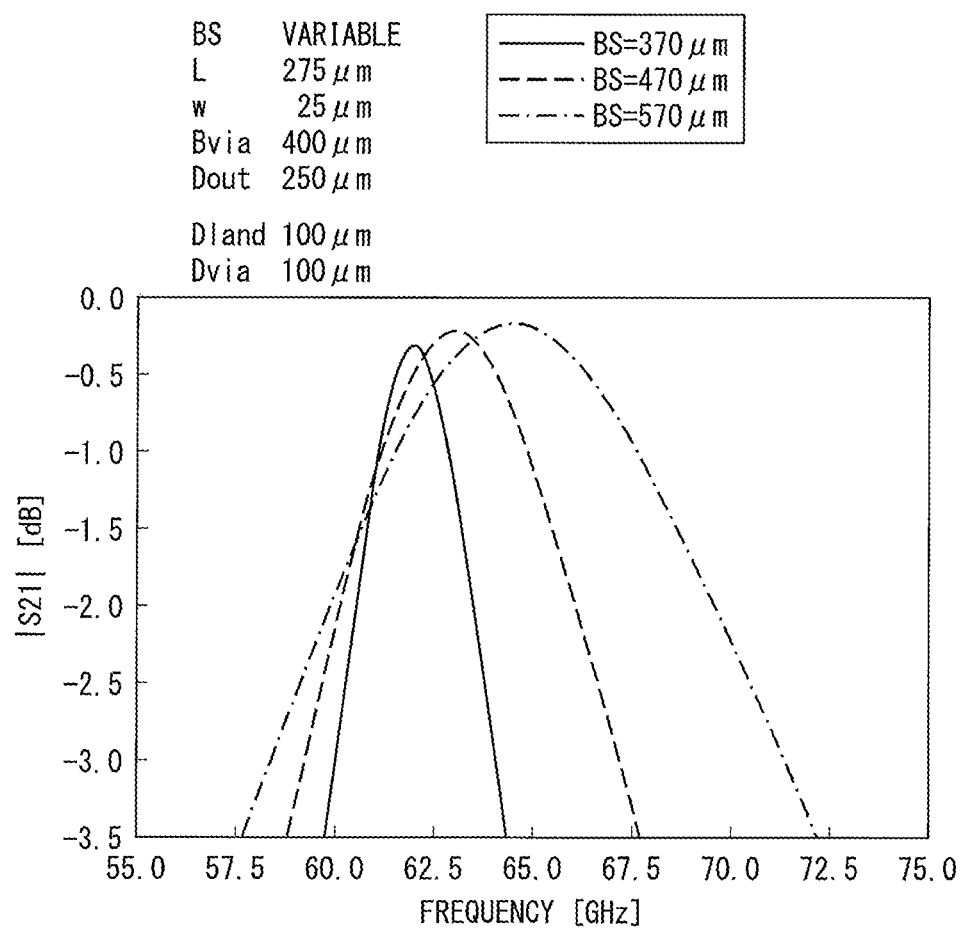

FIG. 7 is a graph showing frequency dependency of |S21| of a filter in accordance with Example Group 3 of the present invention.

Figure 8:
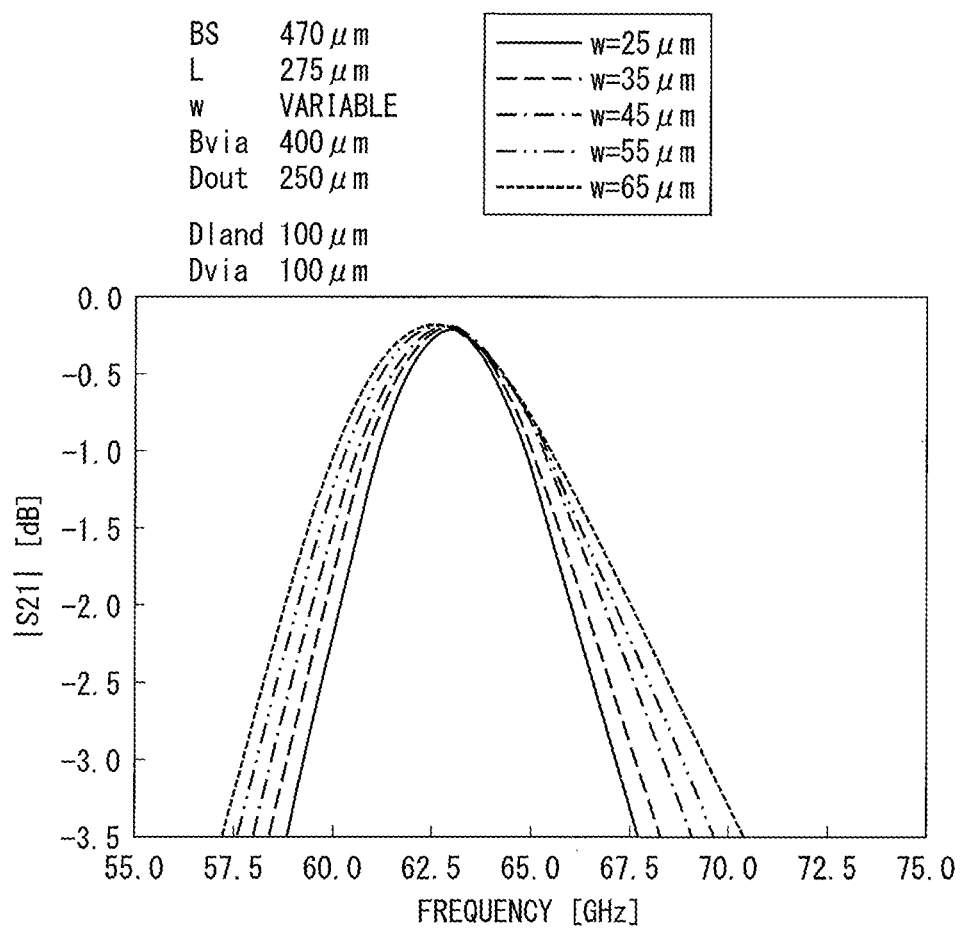

FIG. 8 is a graph showing frequency dependency of |S21| of a filter in accordance with Example Group 4 of the present invention.

Figure 9:
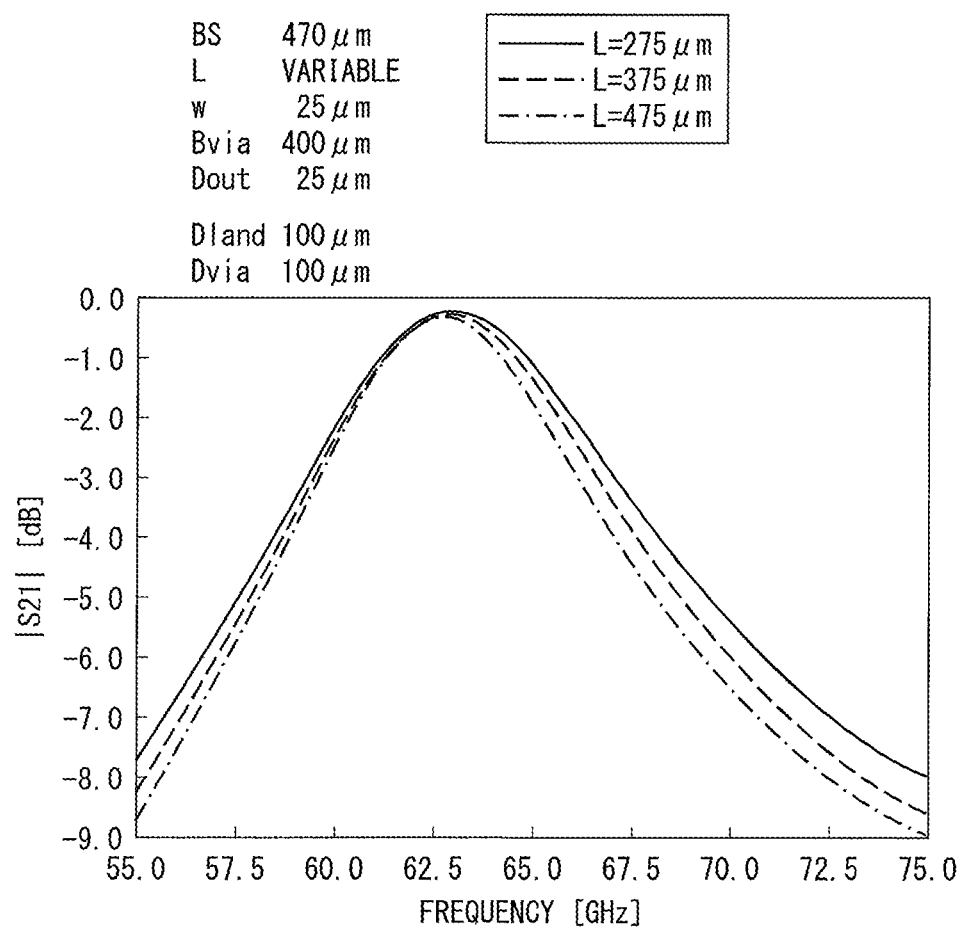

FIG. 9 is a graph showing frequency dependency of |S21| of a filter in accordance with Example Group 5 of the present invention.

Figure 10:
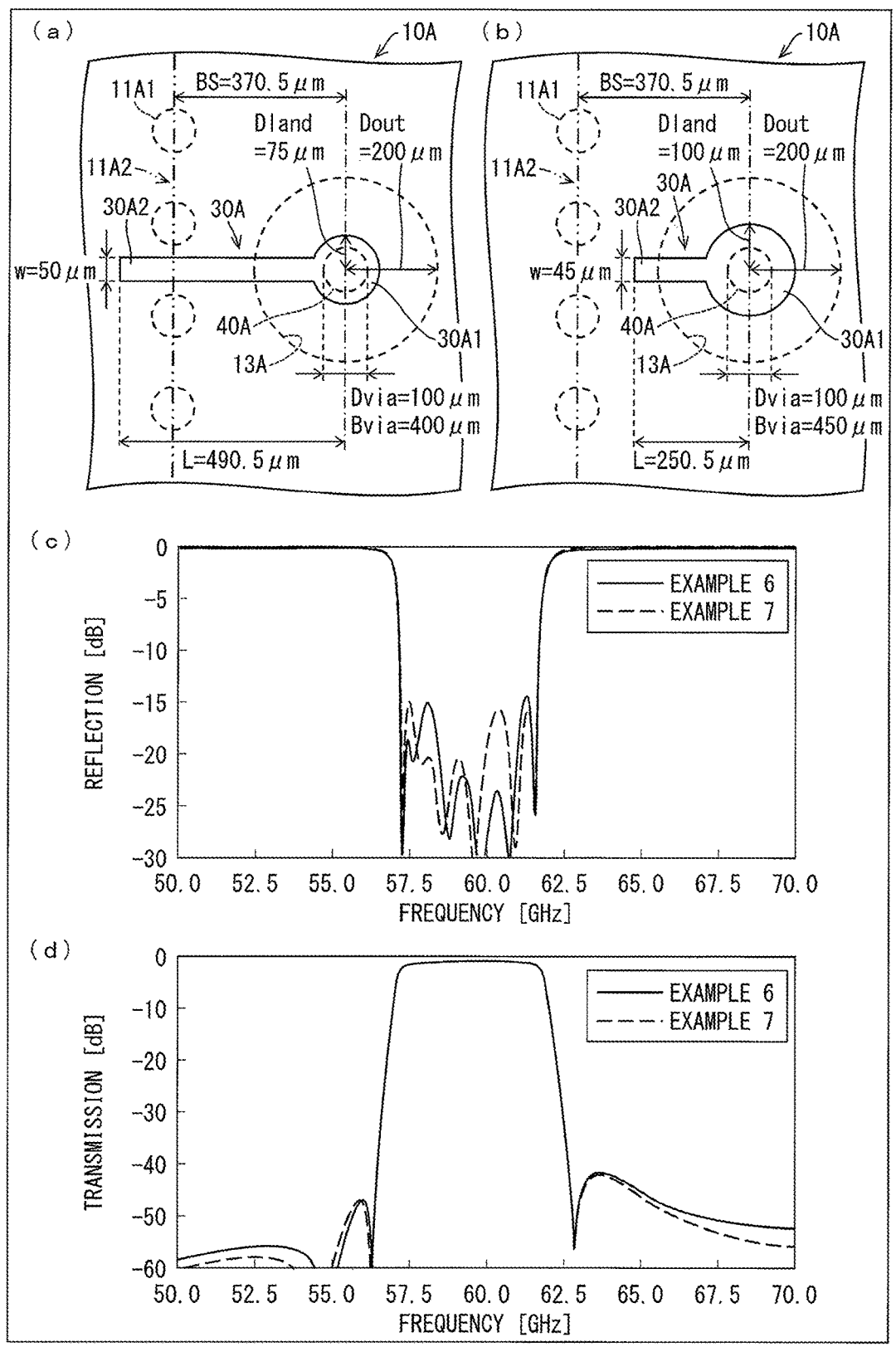

(a) of FIG. 10 is an enlarged plan view illustrating a filter in accordance with Example 6 of the present invention. (b) of FIG. 10 is an enlarged plan view illustrating a filter in accordance with Example 7 of the present invention. (c) of FIG. 10 is a graph showing respective reflection characteristics of filters in accordance with Examples 6 and 7. (d) of FIG. 10 is a graph showing respective transmission characteristics of filters in accordance with Examples 6 and 7.

DESCRIPTION OF EMBODIMENTS

The following description will discuss, with reference to FIG. 1, a filter in accordance with an embodiment of the present invention. FIG. 1 is a perspective view illustrating a configuration of a filter 1 in accordance with the present embodiment.

(Configuration of Filter 1)

As illustrated in FIG. 1, the filter 1 includes resonators 10A and 10B, a dielectric layer 20, strip-shaped conductors 30A and 30B, and blind vias 40A and 40B. The resonators 10A and 10B respectively correspond to the first and second resonators recited in the claims. The strip-shaped conductors 30A and 30B respectively correspond to the first and second strip-shaped conductors recited in the claims. The blind vias 40A and 40B respectively correspond to the first and second conductor pins recited in the claims.

(Resonator 10A)

The resonator 10A is rectangular in shape and includes a narrow wall 11A, a wide wall 12A1, and a wide wall 12A2. The narrow wall 11A, the wide wall 12A1, and the wide wall 12A2 each reflect electromagnetic waves. The electromagnetically reflective walls can be realized by, for example, an electric conductor plate or a post wall constituted by a plurality of conductor posts provided in a fence-like manner. Note that FIG. 1 illustrates the narrow wall 11A, the wide wall 12A1, and the wide wall 12A2 schematically and ignores the respective thicknesses thereof.

The narrow wall 11A surrounds, from four sides, a region serving as an interior of the resonator 10A. The narrow wall 11A is constituted by a short wall 11A2, side walls 11A3, and a partition wall 114, each of which will be later described in detail. The wide wall 12A1 and the wide wall 12A2 form a pair of opposed wide walls. The wide wall 12A1 covers one opening formed by the narrow wall 11A (a top-side opening as seen in FIG. 1), whereas the wide wall 12A2 covers the other opening formed by the narrow wall 11A (a bottom-side opening as seen in FIG. 1).

In this way, an internal cavity of the resonator 10A is formed by the narrow wall 11A, which surrounds four sides, and the pair of wide walls 12A1 and 12A2, which cover the remaining two sides. The shape of the cavity is a rectangular parallelepiped. The cavity can be hollow or filled with a dielectric material. Note that in the present embodiment, the cavity is filled with silica, which is a dielectric.

The strip-shaped conductor 30A is provided on the dielectric layer 20, which is provided on a surface of the wide wall 12A1 (which surface faces away from the cavity of the resonator 10A, i.e., an upper surface as seen in FIG. 1).

The wide wall 12A1 has an anti-pad 13A (the first opening recited in the claims), which is an opening in a region of the wide wall 12A1 which region encompasses a first end 30A1 of the strip-shaped conductor 30A in a plan view of the resonator 10A. In other words, the first end 30A1 is provided above the anti-pad 13A.

The first end 30A1 is electrically connected to the blind via 40A (the first conductor pin in the claims), which is made from a conductive material and is inserted into the cavity through the anti-pad 13A. That is, the strip-shaped conductor 30A and the blind via 40A are electrically connected to each other, but are both electrically insulated from the wide wall 12A1 by the dielectric layer 20 provided interposingly.

A portion of the blind via 40A, which portion is inserted into the cavity, is set to be shorter in length than a distance between the pair of wide walls 12A1 and 12A2. That is, a tip of the blind via 40A reaches only partway through the cavity, without reaching the wide wall 12A2. This causes the blind via 40A to be electrically insulated from the wide wall 12A2.

The strip-shaped conductor 30A and the wide wall 12A1, being separated from each other by the dielectric layer 20, constitute a microstrip line (MSL).

With the above configuration, the blind via 40A serves as a converting section which converts (i) the mode of electromagnetic waves propagated through the strip-shaped conductor 30A into (ii) the mode of standing electromagnetic waves in the cavity of the resonator 10A, or vice versa.

(Resonator 10B)

The resonator 10B is configured so as to be identical to the resonator 10A. That is, the resonator 10B is rectangular in shape and includes a narrow wall 11B, a wide wall 12B1, and a wide wall 12B2. The narrow wall 11B, the wide wall 12B1, and the wide wall 12B2 respectively correspond to the narrow wall 11A, the wide wall 12A1, and the wide wall 12A2 of the resonator 10A.

A strip-shaped conductor 30B is provided on the dielectric layer 20, which is provided on a surface of the wide wall 12B1 (which surface faces away from a cavity of the resonator 10B, i.e., an upper surface as seen in FIG. 1).

The wide wall 12B1 has an anti-pad 13B (the second opening recited in the claims), which is an opening in a region of the wide wall 12B1 which region encompasses a first end 30B1 of the strip-shaped conductor 30B when the resonator 10B is viewed from above.

The first end 30B1 is electrically connected to the blind via 40B (the second conductor pin in the claims) which is made from a conductive material and is inserted into the cavity through the anti-pad 13B.

The strip-shaped conductor 30B, the anti-pad 13B, and the blind via 40B respectively correspond to the strip-shaped conductor 30A, the anti-pad 13A, and the blind via 40A of the resonator 10A.

(Coupling of Resonators 10A and 10B)

The resonator 10A and resonator 10B are provided so as to be adjacent to each other, with a partition wall 114 provided therebetween. The partition wall 114 is a part of the narrow wall 11A and a part of the narrow wall 11B. The partition wall 114 has an opening 114a. Note that in the present embodiment, the opening 114a is rectangular in shape.

Note that out of the walls constituting the narrow wall 11A, a wall provided so as to be opposite to the partition wall 114 will be hereinafter referred to as a short wall 11A2, and walls, provided so as to be orthogonal to (i) the partition wall 114 and (ii) the short wall 11A2, will be hereinafter referred to as respective side walls 11A3.

Similarly, out of the walls constituting the narrow wall 11B, a wall provided so as to be opposite to the partition wall 114 will be hereinafter referred to as a short wall 11B2, and walls provided so as to be orthogonal to (i) the partition wall 114 and (ii) the short wall 11B2, will be hereinafter referred to as respective side walls 11B3.

The resonator 10A and the resonator 10B are electromagnetically coupled via the opening 114a. A larger area of the opening 114a correlates to stronger coupling of the resonator 10A and the resonator 10B.

Note that the resonator 10A and the resonator 10B of the present embodiment are directly coupled to each other, without any resonator provided therebetween. As will be described later with reference to FIG. 4, however, one or more coupled resonators can be further provided between the resonator 10A and the resonator 10B.

(Function of Filter 1)

The filter 1 with the configuration is a direct-coupled-resonator filter. The filter 1 operates in a similar manner regardless of whether (i) the strip-shaped conductor 30A serves as an input port (and the strip-shaped conductor 30B serves as an output port) or (ii) the strip-shaped conductor 30B serves as the input port (and the strip-shaped conductor 30A serves as the output port). The present embodiment describes a case where the strip-shaped conductor 30A serves as the input port.

A second end of the strip-shaped conductor 30A (which end is on a side opposite the first end 30A1) is electrically connected to an external signal source (not shown in FIG. 1), while a second end of the strip-shaped conductor 30B (which end is on a side opposite the end 30B1) is electrically connected to an external load resistor (not shown in FIG. 1).

Electromagnetic waves supplied from the external signal source to the second end of the strip-shaped conductor 30A are propagated through the strip-shaped conductor 30A. The blind via 40A converts (a) a mode of the electromagnetic waves which propagate through the strip-shaped conductor 30A into (b) a mode of standing electromagnetic waves in the respective cavities of the resonators 10A and 10B. The blind via 40B converts (a) the mode of standing electromagnetic waves in the respective cavities of the resonators 10A and 10B into (b) a mode of electromagnetic waves which propagate through the strip-shaped conductor 30B. The electromagnetic waves which propagate through the strip-shaped conductor 30B are supplied, to the external load resistor, from the second end of the strip-shaped conductor 30B.

The filter 1 passes only electromagnetic waves of a predetermined frequency band while reflecting all other electromagnetic waves, in accordance with (i) the shape of the resonators 10A and 10B, (ii) the strength of coupling between the resonators 10A and 10B (coupling coefficient $k_{12}$), (iii) the strength of coupling between the resonator 10A and the external signal source (external Q factor $Q_{eS}$), and (iv) the strength of coupling between the resonator 10B and the external load resistor (external Q factor $Q_{eL}$).

In this way, the filter 1 serves as a band-pass filter for electromagnetic waves (for example, microwaves).

(Effect of Filter 1)

In the filter 1, (i) the strip-shaped conductor 30A and the wide wall 12A1 of the resonator 10A constitute an MSL and (ii) the strip-shaped conductor 30B and the wide wall 12B1 of the resonator 10B constitute an MSL. As such, in a case where, for example, (i) the strip-shaped conductor 30A is connected to the external signal source and (ii) the strip-shaped conductor 30B is connected to the external load resistor so that electromagnetic waves of a high frequency band (for example, a 60-GHz band) are transmitted from the external signal source toward the external load resistor, the filter 1 can, in comparison with the dielectric waveguide tube input/output structure of Patent Literature 1, better suppress electromagnetic wave transmission loss which may occur in circuitry followed by the resonator 10A and in circuitry following the resonator 10B.

The inventor of the present invention found that it was possible to adjust the external Q factor of the filter 1 by altering the following parameters. Note that first through fourth parameters below will be described later.

First parameter: lengths of portions of the respective blind vias 40A and 40B which portions are inserted into the respective resonators 10A and 10B.

Second parameter: (i) a distance between the short wall 11A2 and the blind via 40A and (ii) a distance between the short wall 11B2 and the blind via 40B.

Third parameter: widths of the respective strip-shaped conductors 30A and 30B.

Fourth parameter: radii of the respective anti-pads 13A and 13B.

In this way, the filter 1 allows for adjustment of the external Q factor via a plurality of parameters and therefore allows an increase in degree of freedom in filter design.

As such, the filter 1 makes it possible to provide a filter which enables adjustment of the external Q factor via a plurality of parameters while suppressing transmission loss even in a case where the filter is used for electromagnetic waves of a high frequency band.

[Example Configuration of Filter 1]

The following description will discuss an example configuration of the filter 1 with reference to FIG. 2. (a) of FIG. 2 is a plan view illustrating the example configuration of the filter 1. (b) of FIG. 2 is an enlarged cross-sectional view of the example configuration of the filter 1, taken along line A-A' of (a) of FIG. 2. Note that since the resonator 10A and the resonator 10B are configurationally identical as has been described, the following description of the example configuration will discuss only the resonator 10A, and descriptions of the resonator 10B will be omitted.

The resonators 10A and 10B, constituting the filter 1 of the example configuration, are prepared with the use of a printed circuit board technique. The resonators 10A and 10B share (i) a silica substrate 14 (the dielectric substrate in the claims) made of silica ($SiO_2$), which is a dielectric, (ii) an electric conductor plate 12A1 which covers a surface of the silica substrate 14 (an upper surface as seen in (b) of FIG. 2), and (iii) an electric conductor plate 12A2 which covers a rear surface side of the silica substrate 14 (a lower surface as seen in (b) of FIG. 2). The electric conductor plates 12A1 and 12A2 are a pair of electric conductor plates facing each other, and correspond to the pair of wide walls of the filter 1 illustrated in FIG. 1.

As illustrated in (a) of FIG. 2, the silica substrate 14 has a plurality of through-hole vias which are provided in a fence-like manner so as to pass through the silica substrate 14, from the front surface to the rear surface side thereof. Each of the plurality of through-hole vias has an inner wall provided with a conductor film, which conductor film electrically connects the electric conductor plates 12A1 and 12A2. Each of the conductor films serves as a corresponding one of a plurality of conductor posts 11A1. The plurality of conductor posts 11A1, provided in a fence-like manner, serve as post walls 11A (the first post wall in the claims), which correspond to the narrow wall 11A of the filter 1 illustrated in FIG. 1.

An opening 114a can be formed by not forming some of the conductor posts 11A1 constituting the partition wall 114.

A strip-shaped conductor 30A is provided on the dielectric layer 20, which is provided on a front surface of the wide wall 12A1. A first end 30A1 of the strip-shaped conductor 30A is formed so as to be circular in shape. Such a circular part of the strip-shaped conductor 30A is hereinafter referred to as a land 30A1. The land 30A1 facilitates an alignment during manufacturing of the strip-shaped conductor 30A.

A second end 30A2 of the strip-shaped conductor 30A is formed so as to be square in shape. Such a square part of the strip-shaped conductor 30A is hereinafter referred to as a signal pad 30A2. The signal pad 30A2 is connected to a signal electrode of an external signal source (not shown).

Ground pads 30A3 are provided on both sides of the signal pad 30A2, and are (i) electrically insulated from the strip-shaped conductor 30A and (ii) electrically connected to the wide wall 12A1. Each of the ground pads 30A3 is (i) electrically connected to the wide wall 12A1 via a through hole (not shown) in the dielectric layer 20 and (ii) connected to a ground electrode of the external signal source.

An anti-pad 13A, which is an opening, is provided in a region of the electric conductor plate 12A1 which region is part of the electric conductor plate 12A1 and encompasses the land 30A1, when the resonator 10A is viewed from above.

A via is provided in a region of the silica substrate 14 which region encompasses the land 30A1, when the resonator 10A is viewed from above. The via extends from a front surface of the silica substrate 14 toward a rear surface side thereof. The via has a depth which is less than the thickness of the silica substrate 14. A conductor film is provided on an inner wall of the via. As illustrated in (b) of FIG. 2, the conductor film passes through both the anti-pad 13A and the dielectric layer 20 so as to be electrically connected to the land 30A1. The conductor film constitutes a blind via 40A.

Note that a highly conductive metal, such as copper, can be suitably used as a conductor from which each of the electric conductor plate 12A1 and 12A2, the conductor posts 11A1, the blind via 40A, and the strip-shaped conductor 30A is made. A polyimide, for example, can be suitably employed as a dielectric constituting the dielectric layer 20. Note, however, that (i) the conductor and dielectric are not limited to the above examples of copper and a polyimide, respectively, and (ii) another dielectric substrate, such as a fluorocarbon resin substrate or a ceramic substrate, can be employed instead of the silica substrate 14.

The dielectric layer 20, shared by the resonators 10A and 10B, preferably has a thickness which falls in a range from 10 µm to 30 µm.

Setting the thickness to be not less than 10 µm makes it possible to easily prepare a dielectric layer having sufficient insulation properties and a flat surface.

Setting the thickness to be not greater than 30 µm makes it possible to adjust a characteristic impedance of an MSL, which is constituted by the strip-shaped conductor 30A or 30B and the wide wall 12A1 or 12B1, respectively, to a desired value (for example, 50Ω) even in a case where the strip-shaped conductors 30A and 30B each have a width as narrow as, for example, approximately 25 µm. Setting the respective widths of the strip-shaped conductors 30A and 30B to be as narrow as, for example, approximately 25 µm makes it easy to connect the filter 1 to a semiconductor IC including an external signal source, an external load resistor, and the like.

This is because contact pads (for example, three contact pads for ground, signal, and ground), constituting an interface for connecting a semiconductor IC, are provided at intervals of an order of approximately 100 µm.

[Parameters of Resonator 10A]

Parameters determining a configuration of the filter 1 are determined as follows (see FIG. 2).

A length of a portion of the blind via 40A which portion is inserted into the cavity of the resonator 10A is represented by length Bvia. A diameter of the blind via 40A is represented by diameter Dvia.

A distance between the short wall 11A2 and the blind via 40A is represented by distance BS. Note that in the present disclosure, the distance BS is assumed to be a distance between (i) a center of a central post of the conductor posts 11A1 constituting the short wall 11A2 and (ii) a center of the blind via 40A.

A radius of the anti-pad 13A is represented by as radius Dout, and a radius of the land 30A1 represented by to as radius Dland.

A width of the strip-shaped conductor 30A is represented by width w. Note that in the present disclosure, the width w indicates a width of a portion of the strip-shaped conductor 30A excluding the land 30A1 and the signal pad 30A2, that is, a width of a central portion of the strip-shaped conductor 30A.

A length of the strip-shaped conductor 30A is represented by length L. Note that in the present disclosure, the length L indicates a length measured from a center of the land 30A1 to a tip of the second end (electrode pad) 30A2.

As mentioned above, the resonator 10B is preferably configured identically to the resonator 10A. That is, the length Bvia, the diameter Dvia, the distance BS, the radius Dout, the radius Dland, and the width w are preferably the same in the resonator 10A and the resonator 10B.

(First Variation)

The following description will discuss, with reference to FIG. 3, a first variation of the filter 1 illustrated in FIG. 2. FIG. 3 is an enlarged cross-sectional view illustrating the first variation of the filter 1. A resonator 10A in accordance with the first variation of the filter 1 is different from the resonator 10A of the filter 1 illustrated in FIG. 2, in further including an intermediate land 41.

The intermediate land 41 is a doughnut-shaped electric conductor plate, provided in the same layer as the electric conductor plate 12A1, which is electrically connected to the blind via 40A and the land 30A1. The intermediate land 41 is provided concentrically with the anti-pad 13A so as to be separated from an edge of the anti-pad 13A. That is, the intermediate land 41 is electrically insulated from the wide wall 12A1 in which the anti-pad 13A is provided.

The intermediate land 41 is provided in a region identical to the region in which the land 30A1 is provided, when the resonator 10A is viewed from above.

By further including the intermediate land 41, the resonator 10A allows for an easy alignment during manufacturing of the strip-shaped conductor 30A.

(Second and Third Variations)

The following description will discuss, with reference to FIG. 4, second and third variations of the filter 1 illustrated in FIG. 2.

(a) of FIG. 4 is a block diagram illustrating coupling topology of a filter 1 in accordance with a second variation. (b) of FIG. 4 is a block diagram illustrating coupling topology of a filter 1 in accordance with a third variation.

The filter 1 of each of the second and third variations differs from the filter 1 illustrated in FIG. 2 by further including a resonator provided between the resonator 10A and the resonator 10B. The filter 1 illustrated in FIG. 2 includes two resonators (resonators 10A and 10B). In contrast, the filter 1 of the second variation (see (a) of FIG. 4) includes N resonators (resonators 10A, 10B, 10C, . . . 10x) which are coupled in series. Note, here, that N is an integer greater than or equal to three (3). The filter 1 of the second variation is obtained by generalizing, in series, a given number of direct-coupled-resonators.

The resonator 10A, which is a first resonator, is electrically connected to an external signal source 100S which is followed by the first resonator. The resonator 10B, which is a last resonator, is electrically connected to an external load resistor 100L, by which the last resonator is followed.

Coupling expressed as an external Q factor $Q_{eS}$ occurs between the resonator 10A and the external signal source 100S. Similarly, coupling expressed as an external Q factor $Q_{eL}$ occurs between the resonator 10B and the external load resistor 100L. In a case where (i) the resonators 10A and 10B have been designed using the same parameters and (ii) the external Q factor $Q_{eS}$ and external Q factor $Q_{eL}$ are identical to each other, the external Q factors $Q_{eS}$ and $Q_{eL}$ are simply referred to, with no distinction between the two, as external Q factor $Q_e$.

Coupling expressed as a coupling coefficient $k_{12}$ occurs between the first resonator 10A and the second resonator 10C; coupling expressed as a coupling coefficient $k_{23}$ occurs between the second resonator 10C and a third resonator (not shown); and coupling expressed as a coupling coefficient $k_{N-1N}$ occurs between an (N−1)th resonator 10X and the last resonator 10B (an Nth resonator).

A transmission characteristic of the filter 1 can be adjusted by adjusting the coupling expressed by the external Q factor $Q_e$ and the couplings expressed by respective coupling coefficients $k_{12}$, $k_{23}$, . . . and $k_{N-1N}$.

A filter 1 in accordance with a third variation (see (*b*) of FIG. 4) includes six resonators (resonators 10A through 10F). That is, N=6. The filter 1 of the third variation is an example of a filter in which direct-coupled-resonators are arranged in parallel.

Similarly to the filter 1 of the second variation, in the filter 1 of the third variation, coupling expressed as an external Q factor $Q_{eS}$ occurs between the resonator 10A and an external signal source 100S; coupling expressed as an external Q factor $Q_{eL}$ occurs between the resonator 10B and an external load resistor 100L; coupling expressed as a coupling coefficient $k_{12}$ occurs between the resonator 10A and the resonator 10C, coupling expressed as a coupling coefficient $k_{23}$ occurs between the resonator 10C and the resonator 10D; coupling expressed as a coupling coefficient $k_{34}$ occurs between the resonator 10D and resonator 10E; coupling expressed as a coupling coefficient $k_{45}$ occurs between the resonator 10E and the resonator 10F; and coupling expressed as a coupling coefficient $k_{56}$ occurs between the resonator 10F and the resonator 10B.

Furthermore, in the filter 1 of the third variation, coupling expressed as a coupling coefficient $k_{25}$ occurs between the resonator 10C and the resonator 10F. Such coupling can be caused by, for example, forming an opening in a wide wall, which opening extends across a side wall separating the resonator 10C and the resonator 10F.

Note that the coupling coefficients $k_{12}$, $k_{23}$, $k_{34}$, $k_{45}$, and $k_{56}$ each preferably have a positive value, while the coupling coefficient $k_{25}$ preferably has a negative value. Setting the coupling coefficients in this manner makes it possible to achieve a filter of polarized-type.

EXAMPLE GROUP 1

An Example Group 1 of the filter 1 illustrated in FIG. 2 encompasses filters in which the lengths Bvia of the respective blind vias 40A and 40B have been altered to fall within a range from 100 μm to 500 μm. Note that the resonator 10A and the resonator 10B of Example Group 1 are configurationally identical.

(a) of FIG. 5 shows a frequency dependency of S-parameter |S21| calculated using a filter 1 in accordance with Example Group 1. (b) of FIG. 5 shows a correlation between (i) an external Q factor $Q_e$, calculated from a fractional bandwidth, obtained from (a) of FIG. 5, by using Expression (3) and (ii) length Bvia.

In a simulation of Example Group 1, a thickness of a silica substrate 14 was set to 520 μm, and parameters other than the length Bvia were set to those values indicated in (a) of FIG. 5. Other parameters which determine the transmission characteristics of the resonators 10A and 10B were set such that a center frequency of the S-parameter |S21| was at or near 60 GHz. Note that in Example Groups 2 through 5 (later described) as well, the silica substrate 14 was set to have a thickness of 520 μm, and other parameters were set such that a center frequency was at or near 60 GHz.

As can be seen from (a) of FIG. 5, it was found that an increase in the length Bvia, within the above-described range, correlates to a significantly wider fractional bandwidth of the filter 1. Further, as can be seen from (b) of FIG. 5, it was found that an increase in the length Bvia correlates to a significant decrease in the external Q factor $Q_e$. It was therefore found that the external Q factor $Q_e$ can be controlled to be an arbitrary value by adjusting the length Bvia.

The dashed line shown in (b) of FIG. 5 is fitted to the values of external Q factor $Q_e$ obtained from each filter 1 of Example Group 1. This line can be used to determine a length Bvia which is suitable for obtaining a desired external Q factor $Q_e$, i.e., which is suitable for obtaining a filter 1 having a desired fractional bandwidth.

EXAMPLE GROUP 2

An Example Group 2 of the filter 1 illustrated in FIG. 2 encompasses a filters in which the radius Dout of each of the anti-pads 13A and 13B has been altered to fall within a range from 220 μm to 350 μm. Note that the resonator 10A and the resonator 10B of Example Group 2 are configurationally identical.

FIG. 6 shows a frequency dependency of S-parameter |S21| calculated using a filter 1 in accordance with Example Group 2. Parameters other than the radius Dout were set to those values indicated in FIG. 6.

As can be seen from FIG. 6, it was found that an increase in the length of the radius Dout, within the above-described range, correlates to a significantly narrower fractional bandwidth of the filter 1. As such, it was found that an increase in the length of the radius Dout, within the above-described range, correlates to a significant increase in the external Q factor $Q_e$. That is, it was found that the external Q factor $Q_e$ can be controlled to have an arbitrary value by adjusting the length of the radius Dout.

EXAMPLE GROUP 3

An Example Group 3 of the filter 1 illustrated in FIG. 2 encompasses filters in which a distance BS between (i) the short wall 11A2 or 11B2 and (ii) the corresponding blind via 40A or 40B, respectively, has been altered to be fall within a range from 370 μm to 570 μm. Note that the resonator 10A and the resonator 10B of Example Group 3 are configurationally identical.

FIG. 7 shows a frequency dependency of S-parameter |S21| calculated using a filter 1 in accordance with Example Group 3. Parameters other than the distance BS were set to those values indicated in FIG. 7.

As can be seen from FIG. 7, it was found that an increase in the distance BS, within the above-described range, correlates to a significantly wider fractional bandwidth of the filter 1. As such, it was found that an increase in the distance BS, within the above-described range, correlates to a significant decrease in the external Q factor $Q_e$. That is, it was found that the external Q factor $Q_e$ can be controlled to have an arbitrary value by adjusting the distance BS.

EXAMPLE GROUP 4

An Example Group 4 of the filter 1 illustrated in FIG. 2 encompasses filters in which widths w of the respective strip-shaped conductors 30A and 30B have been altered to fall within a range from 25 μm to 65 μm. Note that the resonator 10A and the resonator 10B of Example Group 4 are configurationally identical.

FIG. 8 shows a frequency dependency of S-parameter |S21| calculated using a filter 1 in accordance with Example Group 4. Parameters other than the width w were set to those values indicated in FIG. 8.

As can be seen from FIG. 8, it was found that an increase in the width w, within the above-described range, correlates to a significantly wider fractional bandwidth of the filter 1. As such, it was found that an increase in the width w, within the above-described range, correlates to a significant decrease in the external Q factor $Q_e$. This is, it was found that the external Q factor $Q_e$ can be controlled to be an arbitrary value by adjusting the width w.

Note that a range of variance in the fractional bandwidth, caused by adjustments to the width w, was smaller than that caused by each of (i) adjustments to the length Bvia, (ii) adjustments to the radius Dout, and (iii) adjustments to the distance BS. As such, in a case where a plurality of parameters are used to adjust fractional bandwidth, the length Bvia, the radius Dout, and the distance BS can each be suitably used as a parameter for making coarse adjustments, whereas the width w can be suitably used as a parameter for making fine adjustments.

EXAMPLE GROUP 5

An Example Group 5 of the filter 1 illustrated in FIG. 2 encompasses filters in which the respective lengths L of the strip-shaped conductors 30A and 30B have been altered to fall within a range from 275 μm to 475 μm. Note that the resonator 10A and the resonator 10B of Example Group 5 are configurationally identical.

FIG. 9 shows a frequency dependency of S-parameter |S21| calculated using a filter 1 in accordance with Example Group 5. Parameters other than the length L were set to those values indicated in FIG. 9.

As can be seen from FIG. 9, it was found that an increase in the length L, within the above-described range, correlates to a fractional bandwidth of the filter 1 which is slightly wider, but the difference is insignificant. In other words, it was found that the fractional bandwidth (i.e., external Q factor $Q_e$) of the filter 1 is not significantly dependent on the length L. As such, the length L can be set (i) independently from the length Bvia, the radius Dout, the distance BS, and the width w and (ii) without consideration for the fractional bandwidth. For example, the strip-shaped conductors 30A and 30B can be set to have a length suitable for the routing thereof, in accordance with the locations of the respective external signal source 100S and the external load resistor 100L.

[Method for Designing Filter 1]

A method of designing the filter 1 includes the steps of: (A) obtaining a correlation, between a parameter and an external Q factor $Q_e$, occurring in a case of altering at least one parameter of first through fourth parameters, the first parameter being the length Bvia, the second parameter being the distance BS, the third parameter being the width w, and the fourth parameter being the radius Dout; and (B) determining, in accordance with the correlation obtained in the step (A), a parameter corresponding to a desired external Q factor $Q_e$.

The above method makes it possible to easily design a filter 1 having a desired external Q factor $Q_e$.

The above method is preferably arranged such that the step (A) is a step of obtaining at least two correlations, between a respective parameter and the external Q factor $Q_e$, occurring in a case of altering at least two parameters of the first through fourth parameters; and the step (B) is a step of determining, in accordance with the at least two correlations obtained in the step (A), at least two parameters corresponding to a desired external Q factor $Q_e$.

The above method makes it possible to design a filter 1, having a desired external Q factor $Q_e$, by adjusting at least two easily adjustable parameters chosen from the first through fourth parameters. As such, the method allows an increase in degree of freedom in designing the filter 1 and therefore facilitates designing of the filter 1.

As has been discussed with references to FIG. 5 through FIG. 8, it was found that the external Q factor $Q_e$ or the fractional bandwidth could be controlled arbitrarily by adjusting each of the length Bvia, the radius Dout, the distance BS, and the width w. It is therefore possible to design, with a great degree of freedom, a filter 1 having a desired fractional bandwidth by adjusting easily adjustable parameters, in combination, selected from the length Bvia, the radius Dout, the distance BS, and the width w.

(b) of FIG. 5 shows a correlation between the external Q factor $Q_e$ and the length Bvia. In contrast, a correlation between (i) each of the radius Dout, the distance BS, and the width w and (ii) the external Q factor $Q_e$ can be obtained in accordance with the results indicated in FIG. 6 through FIG. 8. By obtaining each of the correlations, it becomes possible set, with a great degree of freedom, a value of a parameter suitable for obtaining a filter 1 having a desired external Q factor $Q_e$, i.e., a desired fractional bandwidth.

As such, even in a case where a requirement other than the external Q factor $Q_e$ renders it undesirable to alter any of the length Bvia, the radius Dout, the distance BS, and the width w, it is possible to control the external Q factor $Q_e$ to a desired value by utilizing remaining parameters in combination.

EXAMPLES 6 AND 7

In Examples 6 and 7 of the filter 1 illustrated in FIG. 2, the filter 1 is designed so as to have a coupling topology as illustrated in (b) of FIG. 4. That is, the filter 1 of each of Examples 6 and 7 is a direct-coupled-resonator filter constituted by six resonators, including resonators 10C through 10F, which are provided between the resonator 10A and the resonator 10B. A group of resonators (resonators 10A, 10C, and 10D) provided on a side closer to an external signal source 100S is configurationally identical to a group of resonators (resonator 10B, 10F, and 10E) provided on a side closer to an external load resistor 100L.

The filter 1 of each of Examples 6 and 7 is designed so as to have (i) a center frequency at or near 60 GHz and (ii) an external Q factor $Q_e$ and coupling coefficients as indicated below. Note that only the coupling coefficient $k_{25}$ has a negative value:
$Q_e = 14.43$
$k_{12} = k_{56} = 0.058$
$k_{23} = k_{45} = 0.040$
$k_{34} = 0.0496$
$k_{25} = -0.0113$ (a) of FIG. 10 is an enlarged plan view illustrating a strip-shaped conductor 30A of the resonator 10A included in the filter 1 of Example 6. (b) of FIG. 10 is an enlarged plan view illustrating a strip-shaped conductor 30A of the resonator 10A included in the filter 1 of Example 7.

In the filter 1 of Example 6, each of blind vias 40A and 40B has a length Bvia of 400 μm, and each of strip-shaped conductors 30A and 30B has a width w of 50 μm. All other parameters were set as indicated in (a) of FIG. 10.

In the filter 1 of Example 7, each of blind vias 40A and 40B has a length Bvia of 450 μm, and each of strip-shaped conductors 30A and 30B has a width w of 45 μm. All other parameters were set as indicated in (b) of FIG. 10.

(c) of FIG. 10 shows a reflection characteristic of the filter 1 of each of Examples 6 and 7. (d) of FIG. 10 shows a transmission characteristic of the filter 1 of each of Examples 6 and 7.

As can be seen from (c) of FIG. 10, it was found that the respective filters 1 of Examples 6 and 7 have a return loss of less than −15 dB, and exhibit extremely similar reflection characteristics. As can be seen from (d) of FIG. 10, it was found that the filters 1 of respective Examples 6 and 7 have a fractional bandwidth of 7% in a substantially identical frequency band. The fractional bandwidth of 7% matches the external Q factor $Q_e = 14.43$ that was set at the time of filter design. It was therefore found that the filters 1 of respective Examples 6 and 7 have a reflection characteristic and a transmission characteristic matching those which were intended at the time of filter design.

In this way, it was found that it is possible to realize filters 1 having well-matched fractional bandwidths by adjusting at least two differing parameters (the number of parameters used in Examples 6 and 7 being two), in combination, chosen from the various parameters of the filters 1.

In terms of ease of production, a shorter length Bvia is preferable. That is, Example 6 is more preferable than Example 7. This is because blind vias 40A and 40B each having a shorter length Bvia are easier to produce than those having a longer length Bvia.

By adjusting at least two parameters, in combination, out of the plurality of parameters of the filter 1, it is possible to flexibly meet requirements other than a desired fractional bandwidth (for example, making the length Bvia shorter).

(Recapitulation)

A filter in accordance with an aspect of the present invention includes: a first resonator and a second resonator each including a narrow wall and a pair of wide walls, the first resonator and second resonator being coupled to each other directly or via another resonator; a first strip-shaped conductor which is provided on a dielectric layer provided on a surface of a first wide wall of the first resonator; a first conductor pin which is (i) electrically connected to a first end of the first strip-shaped conductor and (ii) inserted into the first resonator; a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator.

In the filter, (i) the first strip-shaped conductor and the first wide wall of the first resonator constitute a microstrip line and (ii) the second strip-shaped conductor and the first wide wall of the second resonator constitute a microstrip line. As such, in a case where, for example, (i) the first strip-shaped conductor is connected to an external signal source and (ii) the second strip-shaped conductor is connected to an external load resistor so that electromagnetic waves of a high frequency band are transmitted from the external signal source toward the external load resistor, the filter can suppress electromagnetic wave transmission loss which may occur in circuitry followed by the first resonator and circuitry following the second resonator.

The inventor of the present invention found that it was possible to adjust the external Q factor of the filter by altering the following parameters:

first parameter: lengths of portions of the respective first conductor pin and the second conductor pin, which portions are inserted into the respective first resonator and the second resonator;

second parameter: (i) a distance between a first short wall, constituting a portion of the narrow wall of the first resonator, and the first conductor pin and (ii) a distance between a second short wall, constituting a portion of the narrow wall of the second resonator, and the second conductor pin; and third parameter: widths of the respective first strip-shaped conductor and the second strip-shaped conductor.

In this way, the filter enables adjustment of the external Q factor via a plurality of parameters and therefore enables a great degree of freedom in filter design.

As such, the above configuration makes it possible to provide a filter which enables adjustment of the external Q factor via a plurality of parameters while suppressing transmission loss even in a case where the filter is used for electromagnetic waves of a high frequency band.

Note that the filter can be arranged such that the first resonator and the second resonator are directly coupled, or such that another resonator is provided between the first resonator and the second resonator.

Furthermore, a filter in accordance with another aspect of the present invention is preferably arranged such that: the first wide wall of the first resonator partially has a first opening; the first end of the first strip-shaped conductor is provided above the first opening; the first conductor pin passes through the first opening; the first wide wall of the second resonator partially has a second opening; the first end of the second strip-shaped conductor is provided above the second opening; and the second conductor pin passes through the second opening.

The inventor of the present invention found that, in addition to the aforementioned three parameters, it is also possible to adjust the external Q factor of the filter by altering the size of the first and second openings. That is, the sizes of the respective first opening and second opening serve as a fourth parameter. The above configuration therefore makes it possible to further increase the degree of freedom in filter design.

A filter in accordance with another aspect of the present invention is preferably arranged such that: (i) the dielectric layer between the first strip-shaped conductor and the first wide wall of the first resonator and (ii) the dielectric layer between the second strip-shaped conductor and the first wide wall of the second resonator each have a thickness which falls within a range from 10 µm to 30 µm.

Setting the thicknesses of the respective dielectric layers of the first resonator and the dielectric layer of the second resonator to be not less than 10 µm makes it possible to easily prepare a dielectric layer having sufficient insulation properties and a flat surface.

Setting the thicknesses to be not greater than 30 µm makes it possible to adjust a characteristic impedance of a microstrip line, which is constituted by the first strip-shaped conductor and the first wide wall of the first resonator, to a desired value (for example, 50Ω) even in a case where the first strip-shaped conductor has a narrow width. The same applies to a microstrip line constituted by the second strip-shaped conductor and the first wide wall of the second resonator. Setting the respective widths of the first and second strip-shaped conductors to be narrow makes it easy to connect the filter to a semiconductor IC including an external signal source, an external load resistor, and the like.

This is because contact pads (for example, three contact pads for ground, signal, and ground), constituting an interface for connecting a semiconductor IC, are provided at intervals of an order of approximately of 100 µm.

A filter in accordance with another aspect of the present invention is preferably arranged such that: the first resonator and the second resonator share a dielectric substrate whose front surface and rear surface are covered by respective of a pair of electric conductor plates; and the first resonator and the second resonator further include a first post wall and a second post wall, respectively, each constituted by conductor posts provided in a fence-like manner.

The above configuration makes it possible to produce the first resonator and the second resonator by using a printed circuit board technique. That is, the first resonator and the second resonator can be made by using a post-wall waveguide. This makes it possible to reduce the cost of producing the filter.

A filter in accordance with another aspect of the present invention is preferably arranged so as to further include one or more other resonators coupled between the first resonator and the second resonator.

The above configuration makes it possible to adjust the center frequency and the frequency dependency of |S21| of the filter by adjusting coefficients of coupling between respective adjacent resonators.

A method, in accordance with an aspect of the present invention, for designing a filter is a method of designing a filter, the filter including: a first resonator and a second resonator each including a narrow wall and a pair of wide walls, the first resonator and second resonator being coupled to each other directly or via another resonator; a first strip-shaped conductor which is provided on a dielectric layer provided on a surface of a first wide wall of the first resonator; a first conductor pin which is (i) electrically connected to a first end of the first strip-shaped conductor and (ii) inserted into the first resonator; a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator, the method including the steps of: (A) obtaining a correlation, between a parameter and an external Q factor, occurring in a case of altering at least one parameter of first through third parameters, the first parameter being lengths of portions of the respective first and second conductor pins, which portions are inserted into the respective first and second resonators, the second parameter being (i) a distance between (a) a first short wall, constituting a portion of the narrow wall of the first resonator and (b) the first conductor pin and (ii) a distance between (c) a second short wall constituting a portion of the narrow wall of the second resonator and (d) the second conductor pin, the third parameter being widths of the respective first and second strip-shaped conductors; (B) determining, in accordance with a result of the step (A), a parameter corresponding to a desired external Q factor.

Similarly to the aforementioned filter, the above method makes it possible to provide a filter which enables adjustment of the external Q factor via a plurality of parameters while suppressing transmission loss even in a case where the filter is used for electromagnetic waves of a high frequency band. The above method also makes it possible to provide a filter having a desired external Q factor.

The present invention is not limited to the embodiments, but can be altered by a skilled person in the art within the scope of the claims. An embodiment derived from a proper combination of technical means each disclosed in a different embodiment is also encompassed in the technical scope of the present invention.

REFERENCE SIGNS LIST

1 Filter
10A, 10B Resonator (first, second resonator)
11A, 11B Narrow wall (post wall)
11A1, 11B1 Conductor post
11A2, 11B2 Short wall
11A3, 11B3 Side wall
114 Partition wall
114a Opening
12A1, 12B1 First wide wall (first electric conductor plate)
12A2, 12B2 Second wide wall (second electric conductor plate)
13A, 13B Anti-pad (opening)
14 Silica substrate (dielectric substrate)
20 Dielectric layer
30A, 30B Strip-shaped conductor (first, second strip-shaped conductor)
30A1, 30B1 Land (first end of strip-shaped conductor)
40A, 40B Blind via (first, second conductor pin)

The invention claimed is:
1. A filter comprising:
a first resonator and a second resonator coupled to each other directly or via one or more other resonators;
a first strip-shaped conductor which is provided on a dielectric layer provided on a surface of a first wide wall of the first resonator;

a first conductor pin which is (i) electrically connected to a first end of the first strip-shaped conductor and (ii) inserted into the first resonator;

a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator, wherein (1) a partition wall having an opening is provided between the first resonator and the second resonator, and the first resonator and the second resonator are coupled to each other via the opening; or (2) a first partition wall having a first opening is provided between the first resonator and the one or more other resonators and the first resonator and the one or more other resonators are coupled to each other via the first opening, and a second partition wall having a second opening is provided between the second resonator and the one or more other resonators and the second resonator and the one or more other resonators are coupled to each other via the second opening.

2. The filter as set forth in claim 1, wherein:

the first wide wall of the first resonator partially has a first opening;

the first end of the first strip-shaped conductor is provided above the first opening;

the first conductor pin passes through the first opening;

the first wide wall of the second resonator partially has a second opening;

the first end of the second strip-shaped conductor is provided above the second opening; and the second conductor pin passes through the second opening.

3. The filter as set forth in claim 1, wherein (i) the dielectric layer between the first strip-shaped conductor and the first wide wall of the first resonator and (ii) the dielectric layer between the second strip-shaped conductor and the first wide wall of the second resonator each have a thickness which falls within a range from 10 µm to 30 µm.

4. The filter as set forth in of claim 1, wherein:

the first resonator and the second resonator share a dielectric substrate whose front surface and rear surface are covered by respective of a pair of electric conductor plates; and the first resonator and the second resonator further include a first post wall and a second post wall, respectively, each constituted by conductor posts provided in a fence-like manner.

5. A filter as set forth in claim 1, further comprising one or more other resonators coupled between the first resonator and the second resonator.

6. A method of designing a filter, the filter comprising:

a first resonator and a second resonator each including a narrow wall and a pair of wide walls, the first resonator and second resonator being coupled to each other directly or via one or more other resonators;

a first strip-shaped conductor which is provided on a dielectric layer provided on a surface of a first wide wall of the first resonator;

a first conductor pin which is (i) electrically connected to a first end of the first strip-shaped conductor and (ii) inserted into the first resonator;

a second strip-shaped conductor which is provided on a dielectric layer provided on a surface of a first wide wall of the second resonator; and a second conductor pin which is (i) electrically connected to a first end of the second strip-shaped conductor and (ii) inserted into the second resonator, said method comprising the steps of:

(A) obtaining a correlation, between a parameter and an external Q factor, occurring in a case of altering at least one parameter of first through third parameters, the first parameter being lengths of portions of the respective first and second conductor pins, which portions are inserted into the respective first and second resonators, the second parameter being (i) a distance between (a) a first short wall, constituting a portion of the narrow wall of the first resonator and (b) the first conductor pin and (ii) a distance between (c) a second short wall constituting a portion of the narrow wall of the second resonator and (d) the second conductor pin, the third parameter being widths of the respective first and second strip-shaped conductors;

(B) determining, in accordance with a result of the step (A), a parameter corresponding to a desired external Q factor.

* * * * *